United States Patent [19]

Okase

[11] Patent Number: 5,329,095
[45] Date of Patent: Jul. 12, 1994

[54] THERMAL TREATMENT APPARATUS UTILIZING HEATED LID

[75] Inventor: Wataru Okase, Sagamihara, Japan

[73] Assignees: Tokyo Electron Kabushiki Kaisha, Tokyo; Tokyo Electron Tohoku Kabushiki Kaisha, Iwate, both of Japan

[21] Appl. No.: 44,463

[22] Filed: Apr. 9, 1993

[30] Foreign Application Priority Data

Apr. 9, 1992 [JP] Japan .................. 4-088976

[51] Int. Cl.⁵ .......................... H01L 21/205
[52] U.S. Cl. .......................... 219/390; 118/724; 118/730; 392/416; 432/152
[58] Field of Search .......................... 219/390, 405, 411; 392/416, 418, 422, 411; 118/724, 725, 50.1, 728–730; 432/152

[56] References Cited

U.S. PATENT DOCUMENTS 4,943,234  7/1990  Sohlbrand .................. 432/152

FOREIGN PATENT DOCUMENTS 3906075  8/1990  Fed. Rep. of Germany ...... 118/724
734497  5/1980  U.S.S.R. .................. 219/390

Primary Examiner—Bruce A. Reynolds
Assistant Examiner—John A. Jeffery
Attorney, Agent, or Firm—Beveridge, DeGrandi, Weilacher & Young

[57] ABSTRACT

A heater body or a circulation path for a heating gas is provided in an inner surface of a lid body that opens and closes an opening portion of a process tube. The circulation path is formed in such a manner that it passes through a gap between the lid body and the shaft of a rotation mechanism that rotates a quartz boat holding semiconductor wafers within the process tube. A heating gas at a temperature at least as high as the vaporization temperature of reaction products is made to circulate through this circulation path. Since the inner surfaces of the lid body are heated, reaction products do not adhere to the inner walls of the lid body and the lower portions of the process tube. Since there is no source of contamination is generated thereby, the semiconductor wafers and the clean room are not contaminated. Since the circulation gas is made to flow in the reverse direction in the gap, there is no leakage of reaction gas therefrom. Thus the clean room is not contaminated and semiconductor wafers can be fabricated with a good yield.

22 Claims, 4 Drawing Sheets

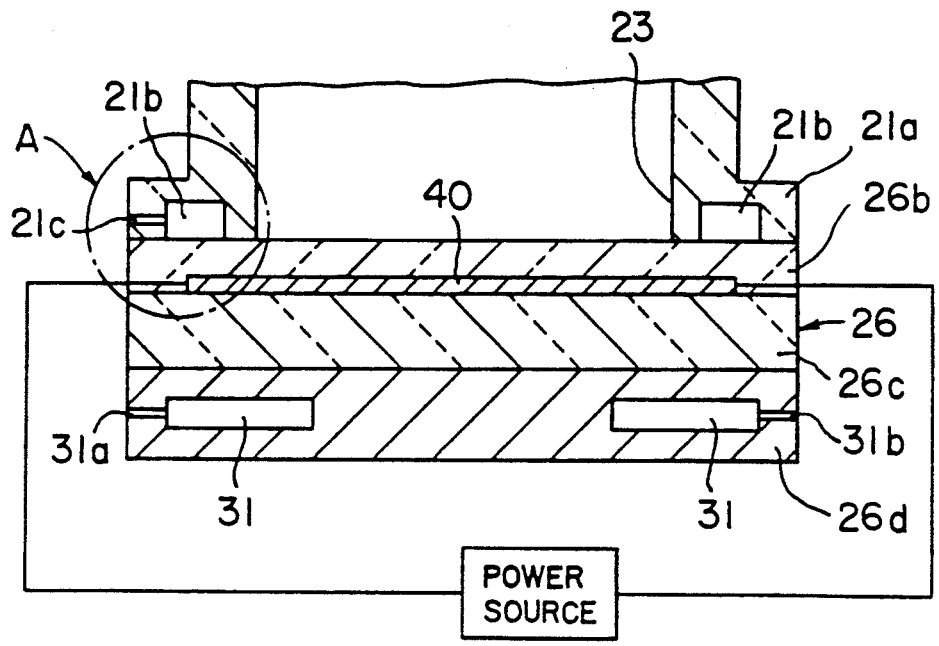
F I G. 2
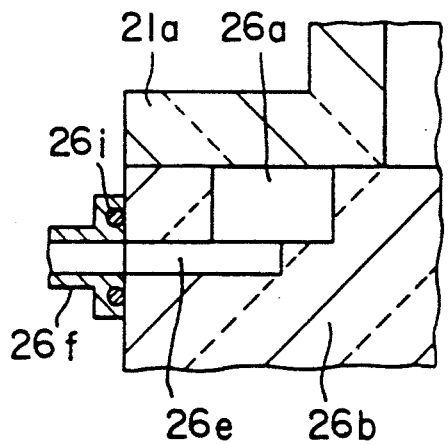
F I G. 3
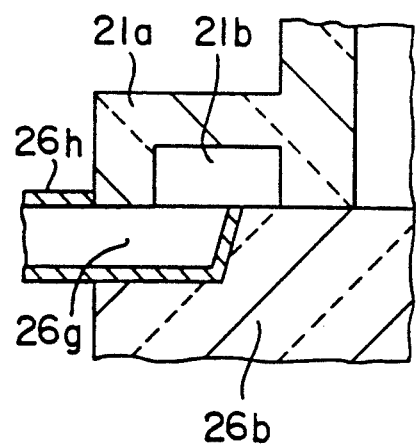
F I G. 4

THERMAL TREATMENT APPARATUS UTILIZING HEATED LID

BACKGROUND OF THE INVENTION

The present invention relates to a thermal treatment apparatus and, in particular, to a thermal treatment apparatus used in the process of fabricating a semiconductor device.

During the conventional process of fabricating a semiconductor device, an apparatus such as a CVD apparatus, oxide film formation apparatus, or diffusion apparatus is used to perform an operation such as form a film or an oxide layer on a semiconductor wafer, or implant impurities. One such apparatus is a thermal treatment apparatus wherein semiconductor wafers are inserted into a reaction vessel by means such as a quartz boat capable of holding a plurality of semiconductor wafers horizontally, and a treatment is performed thereon by a reaction gas introduced into the reaction vessel that has been heated to a high temperature. This thermal treatment apparatus can be used in many different ways to simultaneously and rapidly treat a plurality of semiconductor wafers, by adjusting the temperature and heating.

However, as semiconductor devices have become smaller and also the diameters of semiconductor wafers have increased, there is demand for forming an ultra-thin film on a semiconductor wafer of a large area. The thermal treatment apparatus can perform batch processing in which a plurality of semiconductor wafers are processed at the same time, but unevenness in processing can easily occur between the central and peripheral portions of the same semiconductor wafer, and between semiconductor wafers at different positions within the thermal treatment apparatus. Various improvements have been proposed in the past to prevent this unevenness.

A thermal treatment apparatus of the above type is provided with a vertical cylindrical process tube made of a heat-resistant material such as quartz, and heaters for heating the interior of the process tube to a high temperature of 900° C. to 1200° C., or even higher, are arranged around the process tube. The lower part of the process tube is formed as an opening through which a heat-resistant quartz boat in which a plurality of semiconductor wafers are supported horizontally can be conveyed. The opening is provided with a lid body that has a contrivance such as an O-ring for maintaining the interior airtight. The lid body is supported by a support body that is connected to an elevator drive mechanism with coil springs therebetween, so that the opening of the process tube can be opened and closed thereby. A heat-insulating tube is provided in the lid body, and the entire body of the quartz boat that supports the semiconductor wafers mounted on the heatinsulating tube is positioned in a flat heating zone of the process tube in such a manner that the semiconductor wafers are heated uniformly and are thus treated uniformly. In addition, a circulation path for cooling water is provided in the lid body so that the lid body is cooled and thus apparatuses below the process tube are prevented from being heated.

In order to introduce reaction gas into this process tube, a reaction gas introduction pipe connected to a reaction gas supply body is provided from below the process tube to an upper portion thereof along to the inner wall, and the reaction gas which is heated while it is passing through the introduction pipe is supplied from a supply opening provided in an upper portion of the process tube. The arrangement is such that reaction products created while the semiconductor wafers are being treated are discharged from an exhaust opening which is provided above the process tube and is connected to an exhaust apparatus, together with excess reaction gas.

The thermal treatment apparatus configured in this manner is also provided with a rotation mechanism that rotates the quartz boat of semiconductor wafers to ensure that the treatment effected within each semiconductor wafer is uniform. The rotation mechanism is configured so as to support the heat-resistant tube on a shaft connected to a motor shaft provided on the outside of the process tube.

Unfortunately, reaction products tend to adhere to the lid body and the inner wall at the bottom of the process tube of this conventional thermal treatment apparatus. In particular, when a doping gas such as $POCl_3$ is used in a diffusion apparatus, phosphorous glass fused from phosphorous and $SiO_2$ cannot be prevented from depositing on these areas. There is a danger that adhered substances layered in this way may later peel off and fly into the process tube, contaminating the semiconductor wafers and deteriorating the yield thereof. The adhered substances may also peel off while the semiconductor wafers are being conveyed into or out of the process tube, forming a source of contamination of the clean room.

If the thermal treatment apparatus is provided with a rotation mechanism, there is the danger that reaction products may adhere in the small gap which is formed between a hole in the lid body and the rotational shaft connected to the shaft of the motor, and which is necessary to allow rotation. In the worst case, the reaction products may peel off while the quartz boat is rotating, to form contamination sources.

SUMMARY OF THE INVENTION

The present invention was devised in the light of the above situation with the objective of providing a thermal treatment apparatus wherein reaction products do not adhere to the lid body and the inner wall at the bottom of the reaction vessel, therefore reaction products do not peel off therefrom to contaminate the semiconductor wafers, enabling an improvement in yield and preventing contamination of the clean room in which the thermal treatment apparatus is installed. If a rotation mechanism for rotating the quartz boat is provided in the thermal treatment apparatus, no unpleasant noise is generated during the rotation and a further objective of the present invention is to provide a thermal treatment apparatus wherein the atmosphere within the reaction vessel does not leak into the clean room.

In order to achieve the above objectives, the thermal treatment apparatus of the present invention comprises a cylindrical reaction vessel which has an opening portion through which a holder supporting a stack of horizontally arranged objects to be treated can be inserted from below and which performs a thermal treatment on the objects to be treated, using a reaction gas that is introduced thereinto; a lid body provided in the opening portion of the cylindrical reaction vessel to maintain the contents thereof airtight; and a heater portion provided in such a manner as to surround the cylindrical reaction vessel. The thermal treatment apparatus is further provided with a heating device that heats the inner wall portions of the lid body facing the cylindrical reaction vessel and thus prevents reaction products from adhering thereto. This heating device could be a heater embedded in the lid body, or it could be provided as a circulation path for a heating gas in the lid body.

Heating the lid body ensures that reaction products do not adhere to the lid body and the inner walls of the lower portion of the reaction vessel, and thus ensures that they do not act as sources of contamination of the objects being treated in the reaction vessel, and also do not contaminate the clean room in which the thermal treatment apparatus is installed. In particular, if a heating gas is made to flow within the lid body, and if a gap between a hole in the lid body and a rotational shaft is used as a circulation path for the gas, reaction products are prevented from adhering within this gap and also the atmosphere generated within the reaction vessel does not leak into the clean room. Therefore, the objects to be treated are not contaminated by reaction products, the yield thereof can be improved, and also work can be performed efficiently since there is no necessity to perform frequent maintenance.

BRIEF DESCRIPTION OF THE DRAWINGS

FIG. 2 is a partial cross-sectional side view of a lid body provided with a heating device.

FIG. 3 is a partial cross-sectional side view of one embodiment of portion A (an exhaust seal portion) of FIG. 2.

FIG. 4 is a partial cross-sectional side view of another embodiment of portion A (an exhaust seal portion) of FIG. 2.

DETAILED DESCRIPTION OF THE PREFERRED EMBODIMENTS

Embodiments of the thermal treatment apparatus of the present invention applied to a diffusion apparatus for the fabrication of semiconductor wafers are described below with reference to the accompanying diagrams.

Figure 1:
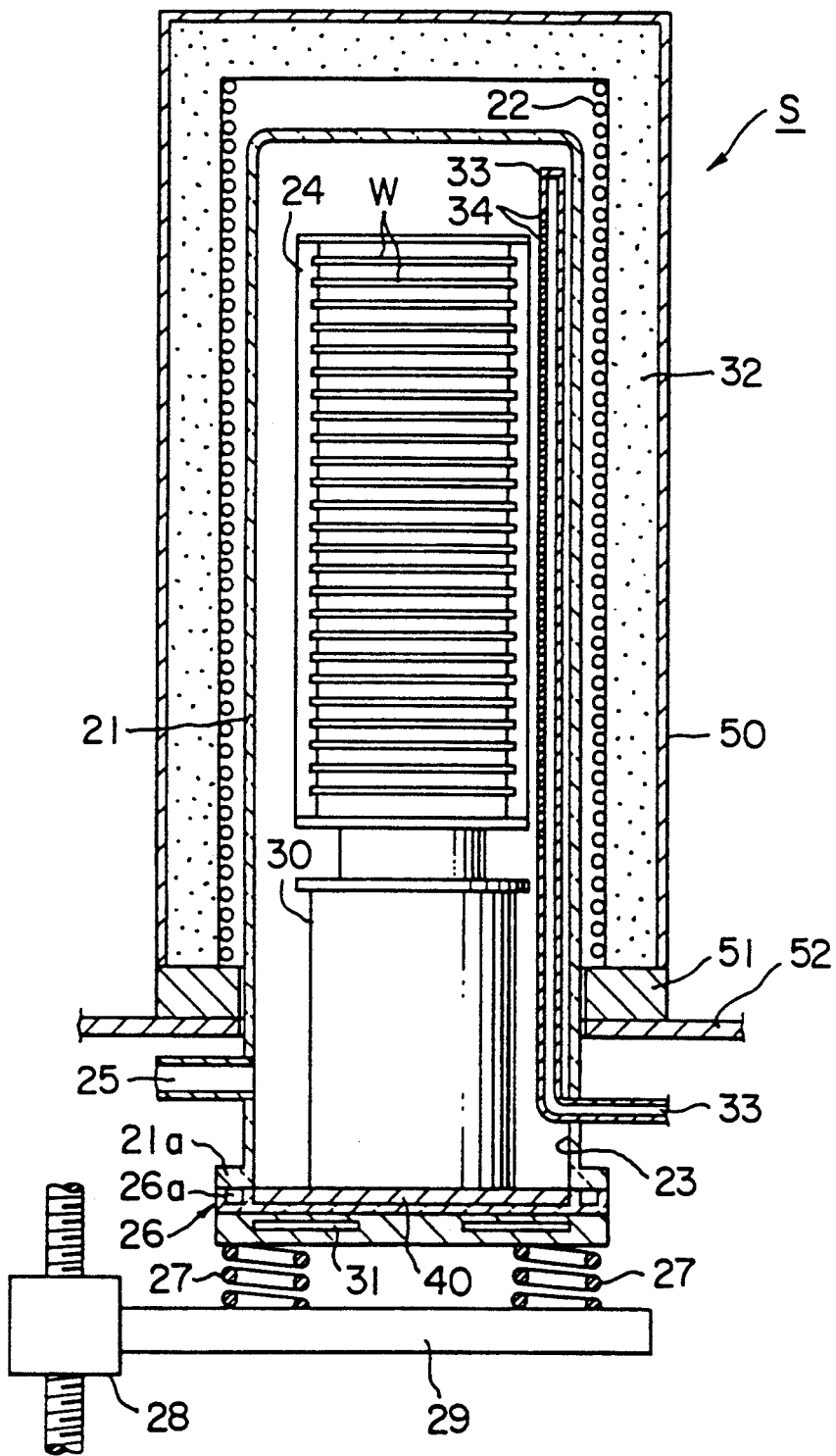
FIG. 1 is a cross-sectional side view of a thermal treatment apparatus provided with a heating device according to the present invention.

A diffusion apparatus S is provided with a process tube 21 which is a cylindrical reaction vessel made of a heat-resistant material such as quartz and which is arranged vertically with an opening portion 23 thereof directed downward, as shown in FIG. 1. The outer periphery of the process tube 21 is surrounded by a coilshaped heater 22 that is a heating portion. The outer periphery of the heater 22 is surrounded by thermal insulation material 32 so as to further increase the efficiency with which the heater 22 heats the process tube 21. The thermal insulation material 32 is surrounded by an outer shell 50 made of special-use stainless steel (SUS), and the lower end of the outer shell 50 is supported by a thermal insulation block 51 made of SUS that is itself supported on a stage 52 also made of SUS. Note that a gap is provided between the inner side of the thermal insulation block 51 and the outer periphery of the process tube 21.

A lid body 26 made of a heat-resistant material such as quartz is provided in the opening portion 23 of the process tube 21, and this lid body 26 can open and close the opening portion 23 and enable the conveying into and out of the process tube 21 of a quartz boat (holder) 24 which is made of a heat-resistant material such as quartz and which supports a plurality of semiconductor wafers W horizontally within the process tube 21. The quartz boat 24 is mounted on a heat-insulating tube 30 that is provided on the lid body 26, and the arrangement is such that the entire quartz boat 24 can be held at a uniform temperature portion in the process tube 21.

A reaction gas introduction pipe 33 linked to a reaction gas supply body is provided along the inner wall surface of the process tube 21, in the vicinity of the opening portion 23 of the process tube 21, and is arranged in such a manner that a reaction gas is supplied into the process tube 21 from supply orifices 34 provided at a plurality of locations along the axial direction of the reaction gas introduction pipe 33. Exhaust openings connected to an exhaust apparatus are provided in a lower part of the process tube 21 in such a manner that excess reaction gas and reaction products generated during the treatment of the semiconductor wafers W are exhausted through the exhaust openings 25, and the interior of the process tube 21 is maintained at a prescribed pressure (normal pressure) for the treatment. If exhaust openings 25 are provided at a plurality of locations (such as three) around the outer periphery of the process tube 21, the flow of reaction gas within the process tube 21 can be made uniform.

The lid body 26 that opens and closes the opening portion 23 of the process tube 21 is supported by a support body (elevator) 29 connected to an elevator drive mechanism 28, with a plurality of coil springs 27 therebetween, and is driven upward or downward by the elevator drive mechanism 28 so as to open or close the opening portion 23 of the process tube 21. The coil springs 27 act to press against the lid body 26 and force the upper surface of the lid body 26 against a flange 21a, when the exhaust openings 25 have been closed. The lid body 26 has a circular peripheral groove 26a in the upper surface thereof, is evacuated from piping linked to the circular peripheral groove 26a to form a gas seal (exhaust seal) with respect to the flange 21a of the process tube 21, and thus the interior of the process tube 21 is maintained airtight. Components that provide a loop-shaped circulation path 31 which circulates a cooling medium are arranged on the outside of the lid body 26, to prevent apparatuses below the lid body 26 from being heated. If the components that provide the circulation path 31 are formed of a material such as SUS, they can efficiently cool the lid body 26.

The inner surface of the lid body 26 facing the process tube 21 is also provided with a heating device 40. The heating device 40 is provided to enable heating of the lid body 26 and the lower portion of the process tube 21 to roughly the same temperature as that of the heat-insulating tube 30. Heating the lid body 26 and the lower portion of the process tube 21 to a temperature that is at least the vaporization temperature of the reaction products, for example 100° C. to 150° C., makes it possible to prevent reaction products from adhering to the lid body 26 and the lower portion of the process tube 21. The above heating device 40 could be a heater that is supplied with electric power by means of a power control apparatus to heat it. A sheath heater, which is a heat-generating body made of a material such as SiC embedded in an insulating body, could be used as appropriate SiC generates heat when electric power is applied to it from outside, it has a high coefficient of thermal conductivity, and also, since it does not react with the reaction gas as a metal would, it can be used advantageously as the heater.

The lid body 26 provided with the heating device 40 is configured as shown in FIG. 2. An upper plate 26b made of quartz is provided on the lid body 26 in such a manner that it is in contact when the opening portion 23 of the process tube 21 is closed, the heating device 40 comprising an SiC heater or resistance heating body is embedded therein, and connection to a power source enables current to be supplied thereto. The lid body 26 is configured in such a manner that an insulation body 26c of quartz of a thickness greater than that of the upper plate 26b is arranged on the under surface thereof, and a base plate 26d of SUS is arranged on the under surface of the insulation body 26c. A cooling medium is introduced from a supply opening 31a provided in the loop-shaped circulation path 31 and is circulated around the circulation path 31, to prevent the apparatuses arranged below the lid body 26 from being heated. The cooling medium is exhausted from an exhaust opening and is recycled back from the supply opening 31a. A circular peripheral groove 21b which opens downward is constructed in the flange 21a of the process tube 21 and an exhaust seal is created via exhaust holes 21c therein. In this manner, since the opening is sealed by an exhaust seal, not by an ordinary 0-ring that has no heat resistance, the lid body 26 itself can be heated.

As shown in FIG. 3, which is an expanded view of portion A of FIG. 2, the upward-opening circular peripheral groove 26a is formed in the upper plate 26b, and an exhaust transmission path 26e therein is sealed by an O-ring to enable an exhaust seal connected to an exhaust pipe 26f, having a flange where the O-ring is inserted, made of quartz. Another embodiment of the portion A is shown in partial expanded form in FIG. 4 wherein the downward-opening circular peripheral groove 21b is formed in the flange 21a of the process tube 21, and the exhaust seal is enabled by an exhaust pipe 26h which is made of quartz and has an exhaust transmission path 26g in the upper plate 26b embedded in the upper plate 26b.

Figure 5:
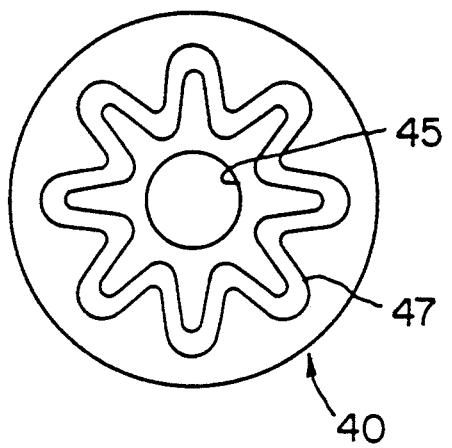
FIG. 5 is a plan view of a heating device provided in a zigzag form.
Figure 6:
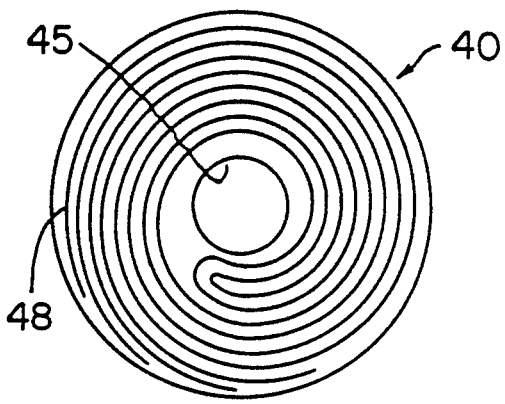
FIG. 6 is a plan view of a heating device provided in a spiral form.

The heating device 40 could be formed of a molded heating body 47 that is shaped in a zigzag form from sheet SiC, as shown in FIG. 5. The heating device 40 could also be heating bodies 48 formed of SiC in spirals, as shown in FIG. 6. Heat can be generated in the heating bodies 47 or 48 by the application of electrical power or the like from the outside.

Figure 7:
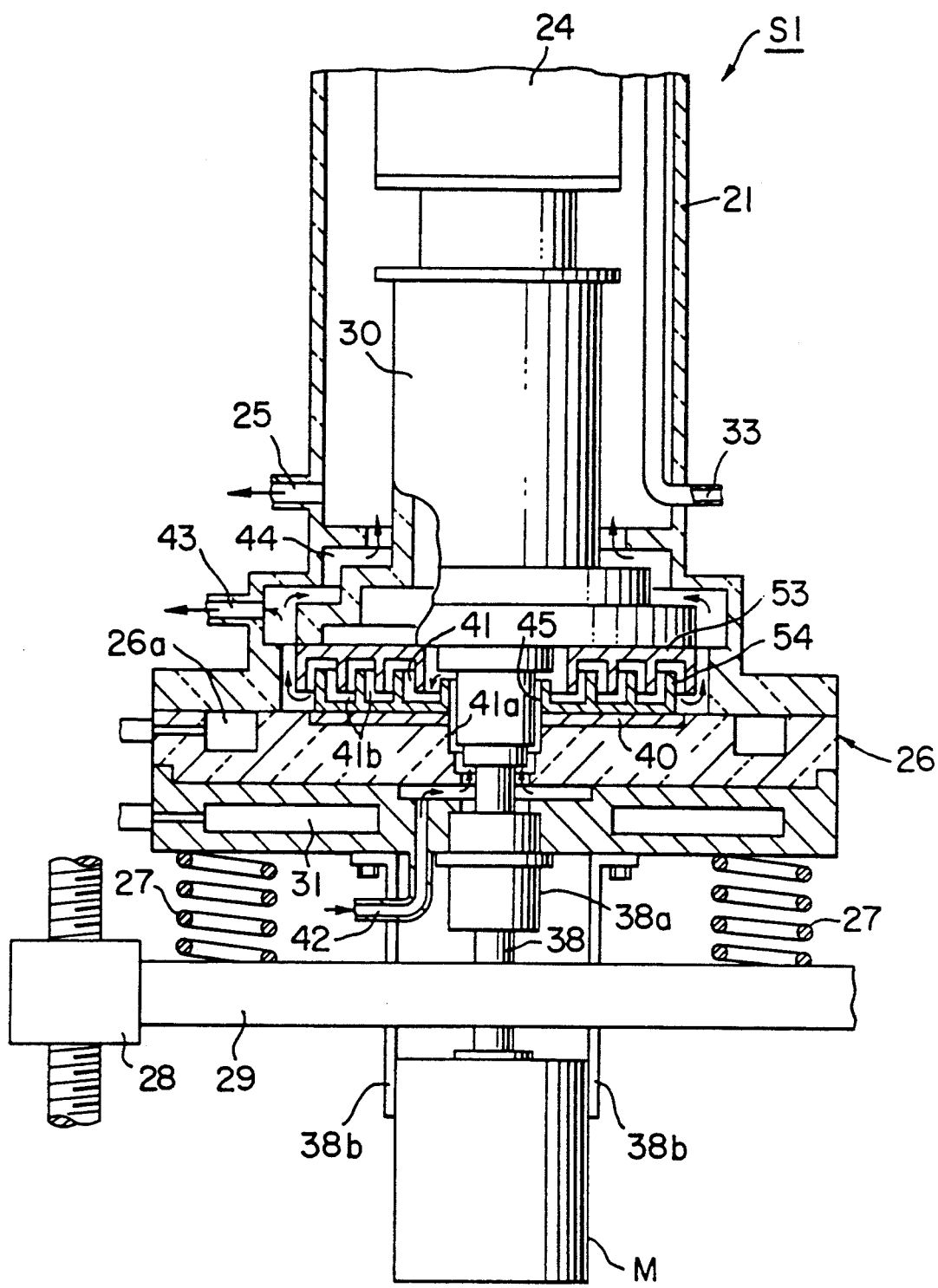
FIG. 7 is a cross-sectional side view of an embodiment having a circulation path for a hightemperature gas that acts as a heating device in a thermal treatment apparatus that is provided with a rotation mechanism for a heat-resistant tube.

If the thermal treatment apparatus is provided with a rotation mechanism to rotate the semiconductor wafers in the reaction vessel, a contrivance that has a circulation path for high-temperature gas could be provided as the heating device arranged in the inner surface of the reaction vessel of the lid body 26, as shown in FIG. 7. In a dispersion apparatus S1 shown in FIG. 7, the heat-insulating tube 30 is connected to a rotation mechanism M. In other words, a shaft 38 linked to the shaft of a motor M that is provided outside the lid body 26 is connected to the heat-insulating tube 30 through a penetration hole 45 of a radius that varies in a step-wise manner and is drilled in the lid body 26, with a magnetic seal 38a therebetween. The motor M is suspended from the under surface of the lid body 26 by brackets 38b. A circulation path 41 for circulation gas is formed of a circulation gas introduction opening 42 which is connected to a circulation gas supply body and which is provided in the lid body 26 of the dispersion apparatus S1, and also a pair of components 53 and 54 of a matching saw-tooth shape in cross-section, via a gap 41a between the shaft 38 and the penetration hole 45 of the lid body 26. The part of the circulation path 41 for the circulation gas that is in the gap 41a in contact with the upper part of the shaft 38 is provided so as to bend along the penetration hole 45 which is drilled through the lid body 26 and which has a radius that varies in a step-wise manner. The gas circulation path also bends along an inner surface portion 41b that is in contact with the heating gas over a wide surface area on the inner surface of the lid body 26, and the hightemperature gas that passes therealong is led to a circulation gas exhaust opening 43.

A gap 44 is provided so as to bend between the inner walls of the process tube 21 as far as the exhaust openings 25 of the process tube 21, provided above the circulation gas exhaust opening 43. Thus, the flow of circulation gas within the gap 44 is configured so that the circulation gas exhausted from the circulation gas exhaust opening 43 passes through this gap 44 and is exhausted from the exhaust openings 25, and thus reaction products do not invade downward from the gap 44. A heating processor 40 (an SiC heater) is provided in the lower surface of the saw-toothed component 54.

Figure 8:
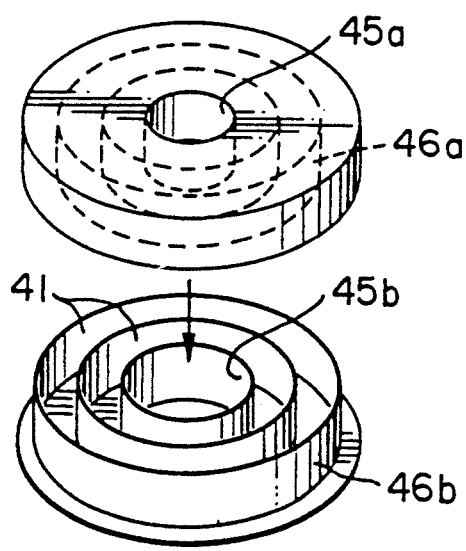
FIG. 8 is a perspective view of a heating device provided in a zigzag form.

The configuration of the circulation path 41 for circulation gas in an inner surface portion 41b of the lid body 26 is, as shown by the portion excluding penetration holes 45a and 45b of the shaft 38 in FIG. 8, such that the gas circulation path 41 is formed between two mating components having annular walls 46a and 46b of radii that vary in the vertical direction.

The thus-configured circulation path 41 is formed of a material such as SiC to ensure that it has good thermal conductivity and does not react with the high-temperature reaction gas, since an inert gas such as nitrogen or argon is heated and circulated therein. To form such complicated shapes in SiC, the required shapes are first formed in graphite and then an SiC film is formed on the surfaces thereof by a CVD apparatus. Subsequently, the graphite is removed by sintering to enable the formation of the circulation path 41 of SiC.

When semiconductor wafers W are treated using the dispersion apparatus S1 of the above configuration, the quartz boat 24 containing untreated semiconductor wafers W is mounted by a conveyor apparatus on the heatinsulating tube 30 on the lid body 26 that has been lowered by the elevator drive mechanism 28 of the diffusion apparatus, the elevator drive mechanism 28 is raised to convey the quartz boat 24 into the process tube 21, and the opening portion 23 of the process tube 21 is closed off by the lid body 26. The lid body 26 is sealed by evacuating the air from the circular peripheral groove 26a by an evacuation apparatus. Air is evacuated from within the process tube 21 through the exhaust openings and the process tube 21 is also heated to the prescribed temperature of between 900° C. and 1200° C. by the heater 22. Reaction gas is then introduced into the process tube 21 from the reaction gas introduction pipe 33. The reaction gas is supplied to the semiconductor wafers W on the support body 29 from the plurality of supply orifices 34 drilled in the reaction gas introduction pipe 33. A gas such as $POCl_3$ or $O_2$ is used as the reaction gas to diffuse phosphorous into the semiconductor wafers W. The apparatus is then evacuated through the exhaust openings 25 by an exhaust apparatus, to exhaust both excess reaction gas and also any reaction products.

At this point, a circulation gas such as $N_2$ or Ar is supplied from the circulation gas introduction opening 42 to the circulation path 41 for circulation gas provided in the lid body 26. The circulation gas is heated to the vaporization temperature of the reaction products, from 100° C. to 150° C., passes from the circulation gas introduction opening 42, through inner surface portion 41b of the circulation path 41 formed in SiC along the gap 41a by the shaft 38 connected to the motor shaft, and is exhausted from the circulation gas exhaust opening 43. Therefore, the inner wall portion of the lid body 26 by the process tube 21 is heated to between 100° C. and 200° C., to ensure that reaction products do not adhere to the lid body 26. Circulation gas that does not exhaust from the circulation gas exhaust opening 43 passes through the gap 44 between the inner wall of the process tube 21 and the heat-insulating tube 30, and is discharged from the exhaust openings 25. The gap 44 is arranged so as to bend, so that reaction components such as $Cl_2$ and $HCl$ that are generated in the process tube 21 do not intrude toward the lid body 26. The gap 41a between the lid body 26 and the shaft 38 is of a radius that varies in a stepwise manner, the circulation gas circulates in the reverse direction therein, and thus the reaction product gases do not pass between the lid body 26 and the shaft 38, and thus do not leak into the clean room in which the dispersion apparatus S1 is installed. Therefore the clean room is not contaminated thereby.

Cooling water or the like is made to flow through the circulation path 31 for the cooling medium of the lid body 26 so that the outer surface of the lid body 26 is cooled thereby, and thus there is no impediment to the work environment and apparatuses outside the dispersion apparatus S1 are not damaged.

After the semiconductor wafers W are treated, and after a certain cooling period has expired, the lid body 26 is lowered by the elevator drive mechanism 28, the quartz boat 24 is also lowered, and the treated semiconductor wafers W are conveyed out of the process tube 21.

If the dispersion apparatus S1 does not have a rotation mechanism, and if the lid body 26 is heated to a prescribed temperature by the heater 40 while the semiconductor wafers W are being treated, reaction products do not adhere to the lid body 26 and the lower part of the process tube 21.

Thus, since reaction products do not adhere to the lid body 26, reaction products peeling off the lid and other components do not adhere to the semiconductor wafers W and degrade the yield. Nor is there any contamination of the clean room from reaction products peeling off from the lid and other components while the semiconductor wafers are being conveyed into and out of the thermal treatment apparatus.

The above description has dealt with embodiments of the present invention by way of example, but it should be obvious to those skilled in the art that the present invention is not limited thereto. For example, the present invention could equally well be applied to a thermal treatment apparatus with no rotation mechanism but provided with circulation paths for circulation gas, or to a thermal treatment apparatus that is provided with a rotation mechanism and also a heater. The present invention is not limited to apparatuses that process semiconductor wafers, but can also be applied to apparatuses that fabricate semiconductor devices. that fabricate semiconductor devices.

What is claimed is:

1. A thermal treatment apparatus comprising:
   a reaction vessel having an opening portion through which a holder for supporting objects to be treated can be inserted, said reaction vessel being constructed for performing a thermal treatment on objects to be treated, using a reaction gas that is introduced thereto;
   a lid body for closing said opening portion of said reaction vessel and for maintaining contents thereto airtight;
   a heating portion provided in such a manner as to surround said reaction vessel;
   a heating device provided in said lid body for heating inner wall surfaces of a portion of said reaction vessel proximal said lid body, and
   means adjacent said lid body for defining a circulation path circulating a heating gas, thereby preventing reaction products from adhering to said inner wall surfaces.

2. The thermal treatment apparatus according to claim 1, wherein said heating device includes a sheath heater embedded within said lid body.

3. The thermal treatment apparatus in accordance with claim 2, wherein said sheath heater is formed of a resistance heating body.

4. The thermal treatment apparatus according to claim 1, wherein said heating device is formed of SiC.

5. The thermal treatment apparatus according to claim 1, wherein a circular peripheral groove is formed in an edge surface of said opening portion of said reaction vessel and wherein an exhaust seal means for said circular peripheral groove is provided.

6. The thermal treatment apparatus according to claim 5, wherein said exhaust seal means is connected to an exhaust pipe having a flange through an elastic seal member.

7. The thermal heat treatment apparatus according to claim 1, wherein said heating device is provided at an intermediate portion between an upper plate and a base plate of said lid body.

8. The thermal treatment apparatus according to claim 1, wherein said lid body includes a base plate where a cooling medium is introduced thereinto.

9. The thermal treatment apparatus according to claim 8, wherein said base plate is disposed on an elevator through a plurality of spring members.

10. The thermal treatment apparatus according to claim 1, wherein a circular peripheral groove is formed in an upper surface of said lid body, and wherein an exhaust seal means for said circular peripheral groove is provided.

11. The thermal treatment apparatus according to claim 10, wherein said exhaust seal means is connected to an exhaust pipe having a flange through an elastic seal member.

12. A thermal treatment apparatus comprising:
   a rotational shaft;

a holder rotatable about said rotational shaft for supporting objects to be treated;

a reaction vessel having an opening portion through which said holder can be inserted, said reaction vessel being constructed for performing a thermal treatment on objects to be treated, using a reaction gas that is introduced thereto;

a heating portion provided in such a manner as to surround said reaction vessel;

a lid body for closing said opening portion of said reaction vessel and for maintaining contents thereof airtight;

a heating device provided in said lid body for heating inner wall surfaces of a portion of said reaction vessel proximal said lid body, and;

means defining a circulation path formed between said lid body and said rotational shaft for circulating a heating gas, thereby preventing reaction products from adhering to said inner wall surfaces.

13. The thermal treatment apparatus according to claim 12, wherein said heating device includes a sheath heater embedded within said lid body.

14. The thermal treatment apparatus according to claim 13, wherein said sheath heater is formed as a resistance heating body.

15. The thermal treatment apparatus according to claim 12, wherein said heating device is formed of SiC.

16. The thermal treatment apparatus according to claim 12, wherein a circular peripheral groove is formed in an edge surface of said opening portion of said reaction vessel and wherein an exhaust seal means for said circular peripheral groove is provided.

17. The thermal treatment apparatus according to claim 16, wherein said exhaust seal means is connected to an exhaust pipe having a flange through an elastic seal member.

18. The thermal heat treatment apparatus according to claim 13, wherein said heating device is provided at an intermediate portion between an upper plate and a base plate of said lid body.

19. The thermal treatment apparatus according to claim 13, wherein said lid body includes a base plate where a cooling medium is introduced thereinto.

20. The thermal treatment apparatus according to claim 19, wherein said base plate is disposed on an elevator through a plurality of spring members.

21. The thermal treatment apparatus according to claim 12, wherein a circular peripheral groove is formed in an upper surface of said lid body, and wherein an exhaust seal means for said circular peripheral groove is provided.

22. The thermal treatment apparatus according to claim 21, wherein said exhaust seal means is connected to an exhaust pipe having a flange through an elastic seal member.

* * * * *